United States Patent
Miwa et al.

(10) Patent No.: US 9,935,313 B2
(45) Date of Patent: Apr. 3, 2018

(54) POSITIVE ELECTRODE FOR LITHIUM SECONDARY BATTERY, MANUFACTURING METHOD THEREOF, AND LITHIUM SECONDARY BATTERY

(71) Applicant: SEMICONDUCTOR ENERGY LABORATORY CO., LTD., Atsugi-shi, Kanagawa-ken (JP)

(72) Inventors: Takuya Miwa, Kanagawa (JP); Nobuhiro Inoue, Kanagawa (JP); Kuniharu Nomoto, Saitama (JP); Junpei Momo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/409,566

(22) Filed: Jan. 19, 2017

(65) Prior Publication Data
US 2017/0133673 A1 May 11, 2017

Related U.S. Application Data

(60) Continuation of application No. 14/923,798, filed on Oct. 27, 2015, now Pat. No. 9,556,536, which is a
(Continued)

(30) Foreign Application Priority Data

Sep. 9, 2011 (JP) .................................. 2011-197021

(51) Int. Cl.
*H01M 4/485* (2010.01)
*H01M 4/36* (2006.01)
(Continued)

(52) U.S. Cl.
CPC .......... *H01M 4/366* (2013.01); *C01B 25/306* (2013.01); *C01B 25/45* (2013.01); *C01B 32/23* (2017.08);
(Continued)

(58) Field of Classification Search
CPC .............................. H01M 4/485; H01M 4/525
See application file for complete search history.

(56) References Cited

U.S. PATENT DOCUMENTS 7,179,561 B2 2/2007 Niu et al.
7,572,542 B2 8/2009 Naoi
(Continued)

FOREIGN PATENT DOCUMENTS

CN 101710619 A 5/2010
CN 101752561 A 6/2010
(Continued)

OTHER PUBLICATIONS

Wang et al. (Angew. Chem. Int. Ed. 2011, 50, 7364-7368).*
(Continued)

*Primary Examiner* — Olatunji Godo
(74) *Attorney, Agent, or Firm* — Nixon Peabody LLP; Jeffrey L. Costellia

(57) ABSTRACT

Occlusion and release of lithium ion are likely to one-dimensionally occur in the b-axis direction of a crystal in a lithium-containing composite oxide having an olivine structure. Thus, a positive electrode in which the b-axes of lithium-containing composite oxide single crystals are oriented vertically to a surface of a positive electrode current collector is provided. The lithium-containing composite oxide particles are mixed with graphene oxide and then pressure is applied thereto, whereby the rectangular parallelepiped or substantially rectangular parallelepiped particles are likely to slip. In addition, in the case where the
(Continued)

rectangular parallelepiped or substantially rectangular parallelepiped particles whose length in the b-axis direction is shorter than those in the a-axis direction and the c-axis direction are used, when pressure is applied in one direction, the b-axes can be oriented in the one direction.

20 Claims, 9 Drawing Sheets

Related U.S. Application Data division of application No. 13/602,350, filed on Sep. 4, 2012, now Pat. No. 9,252,419.

(51) Int. Cl.

| | | |
|---|---|---|
| *H01M 4/04* | (2006.01) | |
| *H01M 4/583* | (2010.01) | |
| *C01B 25/30* | (2006.01) | |
| *C01B 25/45* | (2006.01) | |
| *C30B 29/14* | (2006.01) | |
| *H01M 4/1397* | (2010.01) | |
| *C30B 7/10* | (2006.01) | |
| *H01M 4/62* | (2006.01) | |
| *H01M 10/0525* | (2010.01) | |
| *C01B 32/23* | (2017.01) | |
| *H01M 4/02* | (2006.01) | |

(52) U.S. Cl.
CPC ............... *C30B 7/10* (2013.01); *C30B 29/14* (2013.01); *H01M 4/04* (2013.01); *H01M 4/0404* (2013.01); *H01M 4/0435* (2013.01); *H01M 4/0471* (2013.01); *H01M 4/1397* (2013.01); *H01M 4/485* (2013.01); *H01M 4/583* (2013.01); *H01M 4/62* (2013.01); *H01M 10/0525* (2013.01); *C01P 2006/40* (2013.01); *H01M 2004/028* (2013.01); *Y02P 70/54* (2015.11)

(56) References Cited

U.S. PATENT DOCUMENTS

| | | | |
|---|---|---|---|
| 7,745,047 B2 | 6/2010 | Zhamu et al. | |
| 7,842,432 B2 | 11/2010 | Niu et al. | |
| 7,939,218 B2 | 5/2011 | Niu | |
| 7,977,007 B2 | 7/2011 | Niu et al. | |
| 7,977,013 B2 | 7/2011 | Niu et al. | |
| 8,278,011 B2 | 10/2012 | Zhu et al. | |
| 2007/0009799 A1 | 1/2007 | Zheng | |
| 2007/0131915 A1 | 6/2007 | Stankovich et al. | |
| 2008/0048153 A1 | 2/2008 | Naoi | |
| 2008/0254296 A1 | 10/2008 | Handa et al. | |
| 2009/0017382 A1 | 1/2009 | Yamamoto et al. | |
| 2009/0110627 A1 | 4/2009 | Choi et al. | |
| 2009/0117467 A1 | 5/2009 | Zhamu et al. | |
| 2009/0123850 A1 | 5/2009 | Takeuchi et al. | |
| 2009/0253045 A1 | 10/2009 | Kotato et al. | |
| 2009/0286159 A1* | 11/2009 | Nuspl ................... H01M 4/136 429/221 |
| 2009/0305135 A1 | 12/2009 | Shi et al. | |
| 2010/0081057 A1 | 4/2010 | Liu et al. | |
| 2010/0143798 A1 | 6/2010 | Zhamu et al. | |
| 2010/0159333 A1* | 6/2010 | Sugiura ................... C01G 51/04 429/231.8 |
| 2010/0176337 A1 | 7/2010 | Zhamu et al. | |
| 2010/0233538 A1 | 9/2010 | Nesper et al. | |
| 2010/0233546 A1 | 9/2010 | Nesper et al. | |
| 2010/0248034 A1 | 9/2010 | Oki et al. | |
| 2010/0301279 A1 | 12/2010 | Nesper et al. | |
| 2010/0308277 A1 | 12/2010 | Grupp et al. | |
| 2010/0330421 A1 | 12/2010 | Cui et al. | |
| 2011/0012067 A1 | 1/2011 | Kay | |
| 2011/0111303 A1 | 5/2011 | Kung et al. | |
| 2011/0121240 A1 | 5/2011 | Amine et al. | |
| 2011/0159372 A1 | 6/2011 | Zhamu et al. | |
| 2011/0227000 A1 | 9/2011 | Ruoff et al. | |
| 2011/0229795 A1 | 9/2011 | Niu et al. | |
| 2012/0045692 A1 | 2/2012 | Takemura et al. | |
| 2012/0058397 A1 | 3/2012 | Zhamu et al. | |
| 2012/0088151 A1 | 4/2012 | Yamazaki et al. | |
| 2012/0100402 A1 | 4/2012 | Nesper et al. | |
| 2012/0183839 A1 | 7/2012 | Yuasa et al. | |
| 2012/0308884 A1 | 12/2012 | Oguni et al. | |
| 2012/0308891 A1 | 12/2012 | Todoriki et al. | |
| 2012/0315550 A1* | 12/2012 | Liu ........................ C01B 25/45 429/338 |
| 2013/0017443 A1 | 1/2013 | Yamazaki | |
| 2013/0045418 A1 | 2/2013 | Oguni et al. | |

FOREIGN PATENT DOCUMENTS

| | | |
|---|---|---|
| CN | 102148371 A | 8/2011 |
| EP | 1722428 A | 11/2006 |
| EP | 1772428 A | 4/2007 |
| EP | 2256087 A | 12/2010 |
| EP | 2445049 A | 4/2012 |
| EP | 2511973 A | 10/2012 |
| JP | 06-060870 A | 3/1994 |
| JP | 2006-265751 A | 10/2006 |
| JP | 2007-042620 A | 2/2007 |
| JP | 2008-526664 | 7/2008 |
| JP | 2008-541364 | 11/2008 |
| JP | 2009-500806 | 1/2009 |
| JP | 2009-524567 | 7/2009 |
| JP | 2009-176721 A | 8/2009 |
| JP | 2010-275186 A | 12/2010 |
| JP | 2011-503804 | 1/2011 |
| JP | 2011-048992 A | 3/2011 |
| JP | 2011-076820 A | 4/2011 |
| JP | 2011-517053 | 5/2011 |
| JP | 2011-105569 A | 6/2011 |
| JP | 4765077 | 9/2011 |
| JP | 2012-064571 A | 3/2012 |
| JP | 2012-094516 A | 5/2012 |
| JP | 2012-099467 A | 5/2012 |
| JP | 2012-099468 A | 5/2012 |
| JP | 2012-224526 A | 11/2012 |
| JP | 2013-513904 | 4/2013 |
| WO | WO-2005/121022 | 12/2005 |
| WO | WO-2006/062947 | 6/2006 |
| WO | WO-2006/071076 | 7/2006 |
| WO | WO-2006/119995 | 11/2006 |
| WO | WO-2007/004728 | 1/2007 |
| WO | WO-2007/008422 | 1/2007 |
| WO | WO-2007/061945 | 5/2007 |
| WO | WO-2009/061685 | 5/2009 |
| WO | WO-2009/117871 | 10/2009 |
| WO | WO-2009/127901 | 10/2009 |
| WO | WO-2009/144600 | 12/2009 |
| WO | WO-2011/057074 | 5/2011 |
| WO | WO-2011/069348 | 6/2011 |
| WO | WO-2011/079238 | 6/2011 |
| WO | WO2011069348 A1 * | 6/2011 |
| WO | WO-2011/141486 | 11/2011 |
| WO | WO-2012/023464 | 2/2012 |
| WO | WO-2012/046669 | 4/2012 |
| WO | WO-2012/046791 | 4/2012 |

OTHER PUBLICATIONS

Nishimura.S et al., "Experimental Visualization of Lithium Diffusion in LiXFePo4", Nature Materials, Aug. 10, 2008, vol. 7, No. 9, pp. 707-711.

Andersson.A et al., "Lithium extraction/insertion in LiFePo4: an X-ray diffraction and Mossbauer spectroscopy study", Solid State Ionics, May 1, 2000, vol. 130, pp. 41-52.

Padhi.A et al., "Phospho-olivines as Positive-Electrode Materials for Rechargeable Lithium Batteries", J. Electrochem. Soc. (Journal

(56) References Cited

OTHER PUBLICATIONS of the Electrochemical Society), Apr. 1, 1997, vol. 144, No. 4, pp. 1188-1194.

Su.F et al., "Flexible and planar graphene conductive additives for lithium-ion batteries", J. Mater. Chem. (Journal of Materials Chemistry), 2010, vol. 20, pp. 9644-9650.

Zhou.X et al., "Graphene modified LiFePO4 cathode materials for high power lithium ion batteries", J. Mater. Chem. (Journal of Materials Chemistry), 2011, vol. 21, pp. 3353-3358.

Yu.G et al., "Solution-Processed Graphene/MnO2 Nanostructured Textiles for High-Performance Electrochemical Capacitors", Nano Letters, 2011, vol. 11, No. 7, pp. 2905-2911.

Paek.S et al., "Enhanced Cyclic Performance and Lithium Storage Capacity of SnO2/Graphene Nanoporous Electrodes with Three-Dimensionally Delaminated Flexible Structure", Nano Letters, 2009, vol. 9, No. 1, pp. 72-75.

Wang.G et al., "Sn/graphene nanocomposite with 3D architecture for enhanced reversible lithium storage in lithium ion batteries", J. Mater. Chem. (Journal of Materials Chemistry), 2009, vol. 19, No. 44, pp. 8378-8384.

Wang.D et al., "Self-Assembled T/O2-Graphene Hybrid Nanostructures for Enhanced Li-Ion Insertion", ACS Nano, 2009, vol. 3, No. 4, pp. 907-914.

Chan.C et al., "High-performance lithium battery anodes using silicon nanowires", Nature Nanotechnology, Dec. 16, 2007, vol. 3, pp. 31-35.

Wang.H et al., "LiMn1-xFexPO4Nanorods Grown on Graphene Sheets for Ultrahigh-Rate-Performance Lithium Ion Batteries", Angew. Chem. Int. Ed. (Angewandte Chemie International Edition) Supporting Information, Aug. 1, 2011, vol. 50, No. 32, pp. 7364-7368.

Chinese Office Action (Application No. 201210331146.5) dated Oct. 10, 2015.

* cited by examiner

POSITIVE ELECTRODE FOR LITHIUM SECONDARY BATTERY, MANUFACTURING METHOD THEREOF, AND LITHIUM SECONDARY BATTERY

BACKGROUND OF THE INVENTION

1. Field of the Invention

The present invention relates to a positive electrode for a lithium secondary battery and a method for manufacturing the positive electrode. Further, the present invention relates to a lithium secondary battery.

2. Description of the Related Art

Improvements in output and capacity of a lithium secondary battery which is usable in a portable device, an automotive power supply, or the like are required as portable devices such as smartphones and portable game consoles become widespread and interest in the environment issue grows.

A secondary battery including a lithium secondary battery basically has a structure in which an electrolyte is provided between a positive electrode and a negative electrode. Typically, a positive electrode and a negative electrode each include a current collector and an active material provided over the current collector. In the case of a lithium secondary battery, a material which is capable of occluding and releasing lithium ions is used as an active material for a positive electrode and a negative electrode.

Various approaches to improve the capacity and the output characteristics of a lithium secondary battery have been taken. An increase in the capacity and an improvement in output performance of a positive electrode active material are included in these approaches.

Lithium-containing composite oxide having an olivine structure, such as lithium iron phosphate ($Li_xFePO_4$ ($0<x\leq1$)), has attracted attentions as a material for a positive electrode active material. Lithium iron phosphate has the following advantages: being formed using iron which is very inexpensive as compared to cobalt (Co) and the like; exhibiting high potential (approximately 3.5 V) as a material in which oxidation and reduction of Fe(II) and Fe(III) occur; having favorable cycle characteristics; having a theoretical capacity of approximately 170 mAh/g and having higher energy density than a conventional material such as lithium cobalt oxide ($LiCoO_2$) or lithium nickel oxide ($LiNiO_2$); having a high level of safety; and the like.

It is known that there is a one-dimensional lithium-ion path along the b-axis direction of the crystal lattice of lithium iron phosphate, which is lithium-containing composite oxide having an olivine structure (Non-Patent Document 1).

REFERENCE

Patent Document

[Patent Document 1]
PCT International Publication No. WO2009/117871

Non-Patent Document

S. Nishimura, G. Kobayashi, K. Ohoyama, R. Kanno, M. Yashima and A. Yamada, "Experimental visualization of lithium diffusion in $Li_xFePO_4$", Nature Materials, 2008, Vol. 7, pp. 707-711.

SUMMARY OF THE INVENTION

In other words, there is no lithium-ion path in the directions except the b-axis direction in the lithium-containing composite oxide having an olivine structure, and thus occlusion and release are less likely to occur therein. Therefore, it may be difficult to cause occlusion and release of lithium ions in the case where the b-axes of lithium-containing composite oxide particles are not oriented vertically to a surface of a positive electrode current collector.

However, it has been difficult to control the orientation of the crystal axis of the lithium-containing composite oxide having an olivine structure. For example, as shown in FIG. 1 of Patent Document 1, lithium-containing composite oxide particles which are manufactured by a solid-phase method generally have a substantially spherical shape. Patent Document 1 discloses a secondary battery using acetylene black as a conductive agent and PVdF (polyvinylidene fluoride) as a binder for the lithium-containing composite oxide particles in substantially spherical shape. FIGS. 4A and 4B are schematic views thereof.

A positive electrode 200 in FIG. 4B includes a positive electrode current collector 220 and a positive electrode active material layer 210. The positive electrode active material layer 210 includes lithium-containing composite oxide particles 211 having an olivine structure, a conductive agent 212, and a binder which is not illustrated.

The conductive agent 212 and the binder are used in order to ensure an electron path between the lithium-containing composite oxide particle 211 and the positive electrode current collector 220 and to attach the positive electrode active material layer 210 onto the positive electrode current collector 220. However, materials such as acetylene black and PVdF, which are carbon particles and a one-dimensional polymer, respectively, have a high coefficient of friction. Therefore, the lithium-containing composite oxide particles 211 having an olivine structure, the conductive agent 212, and the binder support each other. The lithium-containing composite oxide particle 211 has a substantially spherical shape, and has the same length in the a-axis direction, the b-axis direction, and the c-axis direction. Therefore, even when pressure is applied to the positive electrode active material layer 210 vertically or substantially vertically to the positive electrode current collector 220 in a manufacturing process as illustrated in FIG. 4A, the directions of the crystal axes of the lithium-containing composite oxide particles 211 are not changed.

Thus, in order to facilitate occlusion and release of lithium ions and increase the capacity of the positive electrode, the present invention focuses on making the b-axes of the lithium-containing composite oxide single crystals oriented vertically to a surface of the positive electrode current collector.

An object of one embodiment of the present invention is to provide a positive electrode in which the b-axes of lithium-containing composite oxide single crystals are oriented vertically to a surface of a positive electrode current collector.

To achieve the object, graphene oxide or multilayer graphene oxide is mixed with the lithium-containing composite oxide particles in one embodiment of the present invention. In addition, rectangular parallelepiped or substantially rectangular parallelepiped particles whose length in the b-axis direction is shorter than those in the a-axis and the c-axis are used as the lithium-containing composite oxide single crystals.

It is known that graphene oxide and multilayer graphene oxide have a sheet-like shape, and in particular, multilayer graphene oxide has low frictional properties. Therefore, when graphene oxide or multilayer graphene oxide is mixed with the lithium-containing composite oxide particles, the particles are coated with the graphene oxide or the multilayer graphene oxide. Therefore, when pressure is applied to the mixture thereof, the lithium-containing composite oxide particles, which are rectangular parallelepipeds or substantially rectangular parallelepipeds, are likely to slip on the graphene oxide or the multilayer graphene oxide. When graphene oxide or multilayer graphene oxide is reduced, the reduced graphene oxide or reduced multilayer graphene oxide has high conductivity and thus has a function as a conductive agent. Further, since the reduced graphene oxide or the reduced multilayer graphene oxide has a sheet-like shape and coats the lithium-containing composite oxide particles, the graphene oxide or the multilayer graphene oxide also has a function as a binder. Therefore, when the reduced graphene oxide or the reduced multilayer graphene oxide is used, a conductive agent and a binder are unnecessary and the proportion thereof can be reduced, so that the proportion of the lithium-containing composite oxide can be increased.

In addition, since rectangular parallelepiped or substantially rectangular parallelepiped particles whose length in the b-axis direction is shorter than those in the a-axis direction and the c-axis direction are used as the lithium-containing composite oxide single crystals, the b-axes of the single crystals can be oriented by application of pressure. For example, when pressure is applied vertically or substantially vertically to the surface of the positive electrode current collector, the b-axes of the single crystals can be oriented vertically to the surface of the positive electrode current collector.

One embodiment of the present invention is a method for manufacturing a positive electrode for lithium secondary battery, including the step of forming a positive electrode active material layer by applying pressure to a mixture vertically or substantially vertically to a surface of a positive electrode current collector. The mixture includes a rectangular parallelepiped or substantially rectangular parallelepiped particle of lithium-containing composite oxide having an olivine structure and graphene oxide or multilayer graphene oxide including 2 to 100 sheets of graphene oxide.

On embodiment of the present invention is a positive electrode for a lithium secondary battery, including a positive electrode current collector and a positive electrode active material layer over the positive electrode current collector. The positive electrode active material layer includes a mixture of a rectangular parallelepiped or substantially rectangular parallelepiped single crystal of lithium-containing composite oxide having an olivine structure and reduced graphene oxide or reduced multilayer graphene oxide including 2 to 100 sheets of reduced graphene oxide. The b-axis of the rectangular parallelepiped or substantially rectangular parallelepiped single crystal of the lithium-containing composite oxide having the olivine structure is oriented vertically to a surface of the positive electrode current collector.

The lithium-containing composite oxide having the olivine structure may be lithium iron phosphate.

A peak intensity ratio of the (020) diffraction to the (101) diffraction ($I_{(020)}/I_{(101)}$) of the lithium-containing composite oxide having the olivine structure in X-ray diffraction spectrum of the positive electrode active material layer may be greater than or equal to 4.5 and less than or equal to 5.5.

According to one embodiment of the present invention, a positive electrode in which the b-axes of lithium-containing composite oxide single crystals are oriented vertically to a surface of a positive electrode current collector can be provided.

DETAILED DESCRIPTION OF THE INVENTION

Figure 1A:
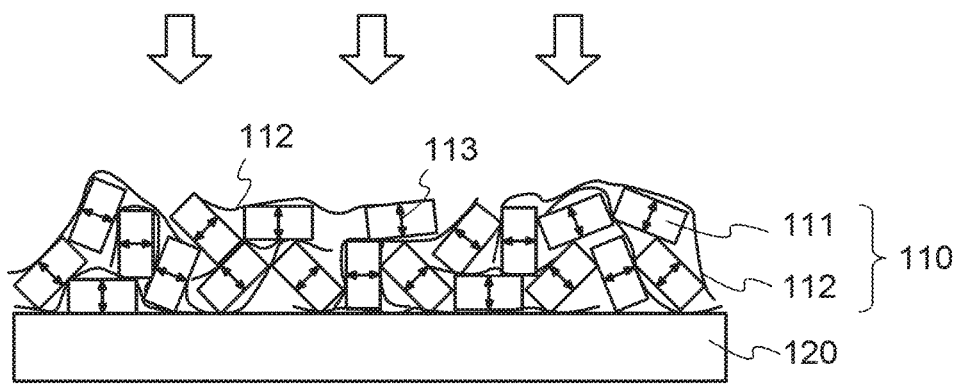
FIGS. 1A and 1B are cross-sectional views illustrating a positive electrode according to one embodiment of the present invention.

Hereinafter, Embodiments are described in detail using the drawings. Note that the invention is not limited to the following description of the embodiments, and it is readily appreciated by those skilled in the art that modes and details of the invention can be modified in a variety of ways without departing from the spirit of the invention disclosed, in this specification and the like. A structure of the different embodiment can be implemented by combination appropriately. On the description of the invention with reference to the drawings, a reference numeral indicating the same part is used in common throughout different drawings, and the repeated description is omitted.

Note that the position, the size, the range, or the like of each structure illustrated in the drawings and the like is not accurately represented in some cases for easy understanding. Therefore, the disclosed invention is not necessarily limited to the position, size, range, or the like disclosed in the drawings and the like.

In this specification and the like, "being oriented" means that the directions of crystal axes of a plurality of single crystal particles are oriented in the same direction. In the case where the directions of the crystal axes of the plurality of single crystal particles are oriented, not all of the crystal axes of the plurality of single crystal particles are necessarily oriented as long as the number of single crystal particles which are oriented in one crystal axis direction is larger than the number of single crystal particles which are oriented in any of the other two crystal axes directions. In addition, not all of the particles are necessarily single crystals. Orientation can be analyzed with X-ray diffraction (XRD) or the like. In addition, the degree of the orientation can be analyzed with a peak intensity ratio of XRD or the like.

Embodiment 1

In this embodiment, examples of a positive electrode 100 and a method for manufacturing the positive electrode 100 which are embodiments of the present invention will be described using FIGS. 1A and 1B.

In the positive electrode 100 in one embodiment of the present invention, graphene oxide or multilayer graphene oxide is mixed with a positive electrode active material layer 110 in the manufacturing process. FIG. 1B illustrates the positive electrode 100 which is one embodiment of the present invention. The positive electrode 100 includes a positive electrode current collector 120 and the positive electrode active material layer 110. The positive electrode active material layer 110 includes olivine-type lithium-containing composite oxide particles 111 and graphene oxide or multilayer graphene oxide 112. Note that arrows 113 in the lithium-containing composite oxide particles 111 denote the b-axis directions.

The graphene oxide or multilayer graphene oxide has a low coefficient of friction as compared to materials such as acetylene black and PVdF. Therefore, when pressure is applied to the positive electrode active material layer 110 vertically or substantially vertically to a surface of the positive electrode current collector 120 as illustrated in FIG. 1A, the lithium-containing composite oxide particles 111 which are in contact with the graphene oxide or multilayer graphene oxide 112 are likely to slip.

In addition, rectangular parallelepiped or substantially rectangular parallelepiped single crystals whose length in the b-axis direction is shorter than those in the a-axis and the c-axis are used as the lithium-containing composite oxide particles 111. The application of pressure to such particles which are mixed with graphene oxide or multilayer graphene oxide makes it easier to orient the b-axes of the single crystals in a direction vertical to the surface of the positive electrode current collector 120, that is, in the thickness direction of the positive electrode active material layer 110. When the b-axes are oriented vertically to the surface of the positive electrode current collector 120, occlusion and release of lithium ions are made easier.

Figure 1B:
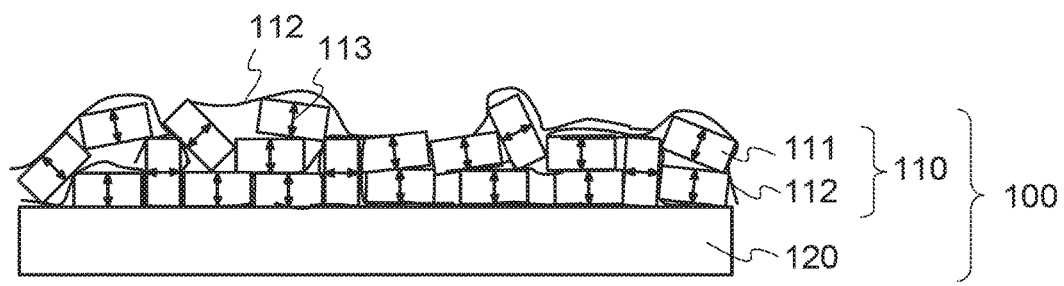

Note that although the graphene oxide or multilayer graphene oxide 112 is illustrated in FIGS. 1A and 1B to describe the method for manufacturing the positive electrode 100, the graphene oxide or multilayer graphene oxide may be reduced in a later step. Therefore, the positive electrode 100 including reduced graphene oxide or reduced multilayer graphene oxide may be employed.

In addition, the positive electrode active material layer 110 in FIGS. 1A and 1B may include a conductive agent, a binder, and the like in addition to the olivine-type lithium-containing composite oxide particles 111 and the graphene oxide or multilayer graphene oxide 112.

<Formation of Lithium-Containing Composite Oxide Particles>

The method for manufacturing the positive electrode 100 which is one embodiment of the present invention is described below in detail with reference to FIGS. 1A and 1B. First, rectangular parallelepiped or substantially rectangular parallelepiped single crystals of lithium-containing composite oxide particles 111 are formed. In the rectangular parallelepiped or substantially rectangular parallelepiped single crystals, a length in the b-axis direction is shorter than those in the a-axis direction and the c-axis direction.

Note that in this specification, a rectangular parallelepiped or substantially rectangular parallelepiped is not necessarily a rectangular parallelepiped in a strict sense as long as it has a shape whose length in the b-axis direction is shorter than those in the a-axis direction and the c-axis direction. Therefore, a rectangular parallelepiped shape in which the angles are round off or a rectangular parallelepiped shape including an uneven surface may be employed, for example. In addition, a flat polygonal prism, or a plate-like shape may be employed.

A material which is represented as $Li_xMPO_4$ ($0<x\le1$) (M=Fe, Mn, Co, or Ni) may be used for the lithium-containing composite oxide particles 111. In particular, lithium iron phosphate (($Li_xFePO_4$ ($0<x\le1$)) is preferably used because it is formed using iron, which is inexpensive and whose resources are abundant. Lithium iron phosphate is used in this embodiment.

As a method for forming such lithium-containing composite oxide particles 111 which are rectangular parallelepiped or substantially rectangular parallelepiped single crystal particles, a sol-gel method, a hydrothermal method, or the like can be used. In particular, a hydrothermal method is preferable because it allows controlling the shape or the diameter of a particle to be generated by adjustment of pH in synthesis, the concentration of the materials, the reaction time, the reaction temperature, an additive, and the like.

In order to synthesize the lithium iron phosphate single crystals which are rectangular parallelepipeds or substantially rectangular parallelepipeds whose length in the b-axis direction is shorter than those in the a-axis direction and the c-axis direction by a hydrothermal method, for example, the materials for the lithium iron phosphate are suspended at a concentration of 0.3 mol/L in water and is processed at 150° C. and 0.4 MPa for 15 hours in an autoclave.

<Formation of Graphene Oxide or Multilayer Graphene Oxide>

There is no particular limitation on a method for forming the graphene oxide or multilayer graphene oxide 112. For example, the graphene oxide or multilayer graphene oxide 112 can be formed in such a manner that graphite is subjected to oxidation treatment to be graphite oxide, and then the graphite oxide is put in a solution and subjected to ultrasonic waves to become flakes.

Note that in this specification, graphene refers to a one-atom-thick sheet of carbon molecules having $sp^2$ bonds. Further, multilayer graphene refers to a stack of 2 to 100 sheets of graphene. The multilayer graphene may include an element at 30 atomic % or less other than carbon. In addition, multilayer graphene may include an element at 15 atomic % or less other than carbon and hydrogen. In addition, graphene which is oxidized and multilayer graphene which is oxidized are referred to as graphene oxide and multilayer graphene oxide, respectively. Further, in graphene oxide or multilayer graphene oxide, some ends of graphene are terminated with carboxyl group (—COOH).

Further, the graphene or multilayer graphene is also referred to as graphene net. One layer of graphite is formed of continuous six-membered rings, whereas one layer of graphene net does not necessarily include six-membered rings only. For example, an eight-membered ring or a carbon ring including nine or more ring members may exist in one layer of graphene net.

<Manufacture of Positive Electrode>

Next, the lithium-containing composite oxide particles 111 and the graphene oxide or multilayer graphene oxide 112 are mixed with each other to form slurry.

The slurry is applied to the positive electrode current collector 120 and dried, so that the positive electrode active material layer 110 is formed over the positive electrode current collector 120. Note that although the positive electrode active material layer 110 is formed over one surface of the positive electrode current collector 120 in FIGS. 1A and 1B, the positive electrode active material layer 110 may be formed over both surfaces of the positive electrode current collector 120.

Pressure is applied to the positive electrode active material layer 110 vertically or substantially vertically to the surface of the positive electrode current collector 120 (see FIG. 1A). The application of pressure can be performed by any method as long as the pressure is applied to the positive electrode active material layer 110 toward substantially one direction. For example, the application of pressure can be performed with a roller press machine.

The application of pressure makes the lithium-containing composite oxide particles of the positive electrode active material layer 110 slip on the graphene oxide or multilayer graphene oxide, so that the b-axes of the lithium-containing composite oxide particles can be oriented vertically to the surface of the positive electrode current collector 120 (see FIG. 1B).

After that, the graphene oxide or multilayer graphene oxide in the positive electrode active material layer 110 is reduced to be graphene or multilayer graphene. The reduction can be performed by baking, for example.

As a result of the reduction, the lithium-containing composite oxide particles 111 are coated with the reduced graphene oxide or reduced multilayer graphene oxide.

After that, the positive electrode current collector 120 and the positive electrode active material layer 110 are processed into a desired shape, thereby providing the positive electrode 100. In this manner, the positive electrode 100 which is one embodiment of the present invention can be manufactured.

Embodiment 2

In this embodiment, a lithium secondary battery 151 according to one embodiment of the present invention and an example of a method for manufacturing the lithium secondary battery 151 will be described with reference to FIGS. 2A and 2B.

The lithium secondary battery 151 according to one embodiment of the present invention includes at least a positive electrode, a negative electrode, and an electrolyte solution. The positive electrode is the positive electrode 100 described in Embodiment 1.

The electrolyte solution is a nonaqueous solution containing salt or an aqueous solution containing salt. The salt contains at least lithium ions that serve as carrier ions.

Figure 2A:
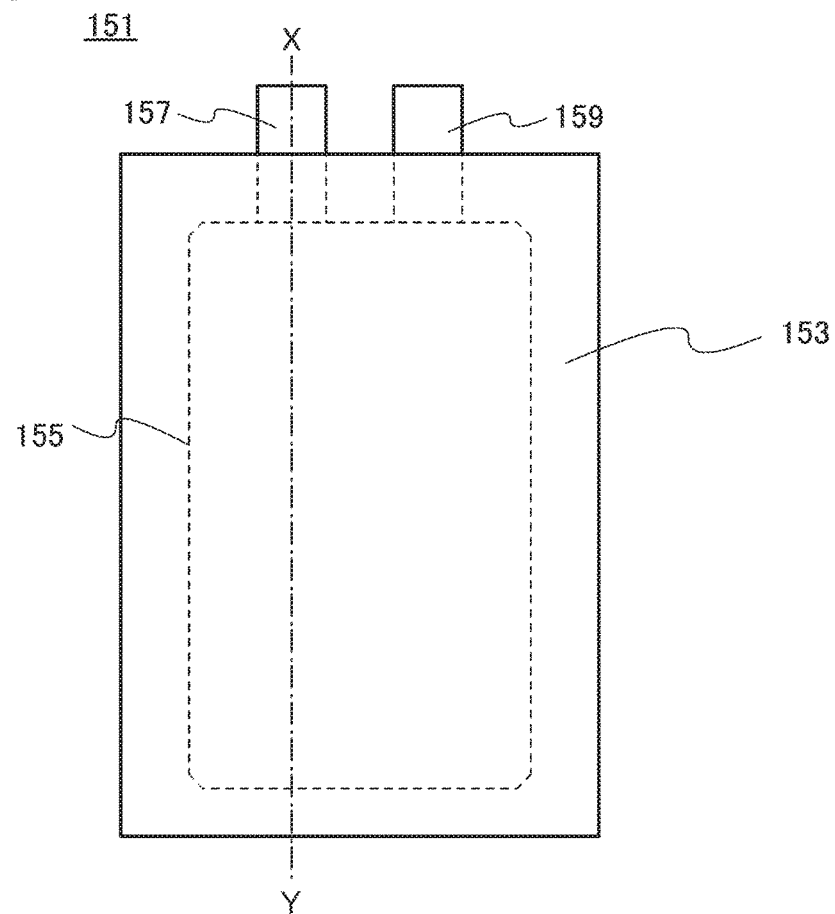
FIGS. 2A and 2B are a plan view and a cross-sectional view illustrating a lithium secondary battery according to one embodiment of the present invention.

The lithium secondary battery 151 illustrated in FIG. 2A includes a power storage cell 155 in an exterior member 153. The lithium secondary battery 151 further includes terminal portions 157 and 159 which are connected to the power storage cell 155. For the exterior member 153, a laminate film, a polymer film, a metal film, a metal case, a plastic case, or the like can be used.

Figure 2B:
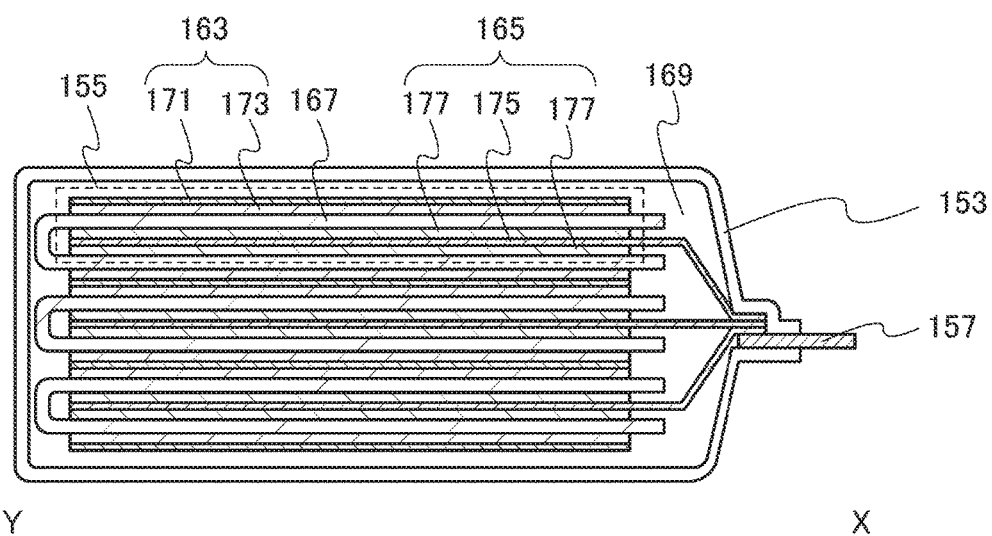

FIG. 2B illustrates a cross section of the lithium secondary battery 151 along line X-Y illustrated in FIG. 2A. As illustrated in FIG. 2B, the power storage cell 155 includes a negative electrode 163, a positive electrode 165, a separator 167 between the negative electrode 163 and the positive electrode 165, and an electrolyte solution 169 with which the exterior member 153 is filled.

The positive electrode 165 corresponds to the positive electrode 100 described in Embodiment 1. A positive electrode current collector 175 is connected to the terminal portion 157. A negative electrode current collector 171 is connected to the terminal portion 159. Further, the terminal portion 157 and the terminal portion 159 each partly extend outside the exterior member 153.

The negative electrode 163 includes the negative electrode collector 171 and a negative electrode active material layer 173. The negative electrode active material layer 173 is formed on one or opposite surfaces of the negative electrode current collector 171. In addition, the negative electrode active material layer 173 may include a binder and a conductive agent.

Although a sealed thin lithium secondary battery is described as the lithium secondary battery 151 in this embodiment, the external shape of the lithium secondary battery 151 is not limited thereto. The external shape of the lithium secondary battery 151 may be varied; for example, a button-type lithium secondary battery, a cylindrical lithium secondary battery, a square-type lithium secondary battery, or the like may be employed. Further, although the structure in which the positive electrode, the negative electrode, and the separator are stacked is described in this embodiment, a structure in which the positive electrode, the negative electrode, and the separator are rolled may be employed.

For the negative electrode current collector 171, a conductive material such as titanium, aluminum, or stainless steel which is processed into a foil shape, a plate shape, a net shape, or the like is used. Furthermore, a conductive layer which is provided by deposition separately on a substrate and then separated from the substrate can be also used as the negative electrode current collector 171.

For the negative electrode active material layer 173, a material which is capable of electrochemically occluding and releasing lithium ions is used. For example, lithium, aluminum, a carbon-based material, tin, tin oxide, silicon, silicon oxide, silicon carbide, a silicon alloy, germanium, or the like can be used. Alternatively, a compound containing one or more materials selected from lithium, aluminum, a carbon-based material, tin, tin oxide, silicon, silicon oxide, silicon carbide, a silicon alloy, and germanium, may be used. Note that a graphite powder, a graphite fiber, or the like can be used as a carbon-based material which is capable of occluding and releasing lithium ions. The amount of lithium ions occluded by silicon, a silicon alloy, germanium, lithium, aluminum, and tin is larger than that by a carbon-base material. Therefore, it is possible to reduce the amount of the material used for the negative electrode active material layer 173, which enables a reduction in cost and miniaturization of the lithium secondary battery 151.

The negative electrode active material layer 173 may be formed by processing of any of the above materials into an uneven shape by a printing method, an inkjet method, CVD, or the like. Alternatively, the negative electrode active material layer 173 may be formed in such a manner that a film of any of the above materials is formed by a coating method, a sputtering method, a vacuum evaporation method, or the like and then the film material is partly removed to have an uneven surface.

Note that one of the above materials which are applicable to the negative electrode active material layer 173 may be used alone as the negative electrode without the negative electrode current collector 171.

The negative electrode active material layer 173 may include graphene, multilayer graphene, reduced graphene oxide, or reduced multilayer graphene oxide. For example, graphene or multilayer graphene may be provided so as to cover a negative electrode active material. This makes it possible to suppress influence of occlusion and release of lithium ions upon the negative electrode active material layer 173. The influence means that, for example, the negative electrode active material layer 173 is expanded or contracted and then the negative electrode active material layer 173 turns into powder or is separated. Multilayer graphene can occlude and release lithium ions; therefore, the negative electrode can occlude a larger amount of lithium ions in the case where multilayer graphene is included.

For the electrolyte solution 169, a salt containing lithium ions is used. For example, a lithium salt, such as $LiClO_4$, $LiAsF_6$, $LiBF_4$, $LiPF_6$, or $Li(C_2F_5SO_2)_2N$, can be used.

The electrolyte solution 169 is preferably a nonaqueous solution containing salt. That is, as a solvent of the electrolyte solution 169, an aprotic organic solvent is preferably used. Examples of the aprotic organic solvent include ethylene carbonate, propylene carbonate, dimethyl carbonate, diethyl carbonate, γ-butyrolactone, acetonitrile, dimethoxyethane, and tetrahydrofuran, and one or more of these materials can be used. Alternatively, as the aprotic organic solvent, one ionic liquid or a plurality of ionic liquids may be used. Owing to non-flammability and non-volatility of an ionic liquid, it is possible to suppress explosion, inflammation, and the like of the lithium secondary battery 151 at the time when the internal temperature of the lithium secondary battery 151 rises, resulting in improvement in safety.

In addition, the use of a gelled high-molecular material containing salt as the electrolyte solution 169 enables an improvement in safety against liquid leakage and the like and a reduction in thickness and weight of the lithium secondary battery 151. Examples of the gelled high-molecular material include a silicon gel, an acrylic gel, an acrylonitrile gel, polyethylene oxide, polypropylene oxide, a fluorine-based polymer, and the like.

As the electrolyte solution 169, a solid electrolyte such as $Li_3PO_4$ can be used.

The lithium secondary battery 151 preferably includes a separator. An insulating porous material can be used as the separator 167. For example, paper; a glass fiber; ceramics; a synthetic fiber containing nylon (polyamide), vinylon (polyvinyl alcohol based fiber), polyester, acrylic, polyolefin, or polyurethane; or the like can be used. Note that a material which does not dissolve in the electrolyte solution 169 needs to be selected.

A lithium secondary battery has a small memory effect, a high energy density, and a high charge/discharge capacity. In addition, the output voltage of the lithium secondary battery is high. Thus, the lithium secondary battery can be smaller in size and more lightweight than a conventional secondary battery even when they have the same capacity. Further, little degradation due to its repetitive charge and discharge occurs and long-time use is possible. The use of the positive electrode according to one embodiment of the present invention leads to further increase in the capacity of a lithium secondary battery.

Note that this embodiment can be implemented in appropriate combination with any of the structures of the other embodiments and example.

Embodiment 3

A lithium secondary battery according to one embodiment of the present invention can be used for power supplies of a variety of electric appliances.

Specific examples of electric appliances each utilizing the lithium secondary battery according to one embodiment of the present invention are as follows: display devices, lighting devices, desktop personal computers and laptop personal computers, image reproduction devices which reproduce still images and moving images stored in recording media such as digital versatile discs (DVDs), mobile phones, portable game machines, personal digital assistants, tablet terminals, e-book readers, video cameras, digital still cameras, high-frequency heating appliances such as microwave ovens, electric rice cookers, electric washing machines, air-conditioning systems, electric refrigerators, electric freezers, electric refrigerator-freezers, freezers for preserving DNA, and medical electrical equipment such as dialyzers. In addition, moving objects driven by an electric motor using power from a lithium secondary battery are also included in the category of electric appliances. As examples of the moving objects, electric vehicles, hybrid vehicles which include both an internal-combustion engine and a motor, motorized bicycles including motor-assisted bicycles, and the like can be given.

In the electric appliances, the lithium secondary battery according to one embodiment of the present invention can be used as a lithium secondary battery for supplying enough power for almost the whole power consumption (referred to as main power supply). Alternatively, in the electric appliances, the lithium secondary battery according to one embodiment of the present invention can be used as a lithium secondary battery which can supply power to the electric appliances when the supply of power from the main power supply or a commercial power supply is stopped (such a lithium secondary battery is referred to as an uninterruptible power supply). Further alternatively, in the electric appliances, the lithium secondary battery according to one embodiment of the present invention can be used as a lithium secondary battery for supplying electric power to the electric appliances at the same time as the electric power supply from the main power supply or a commercial power supply (such a lithium secondary battery is referred to as an auxiliary power supply).

Figure 3:
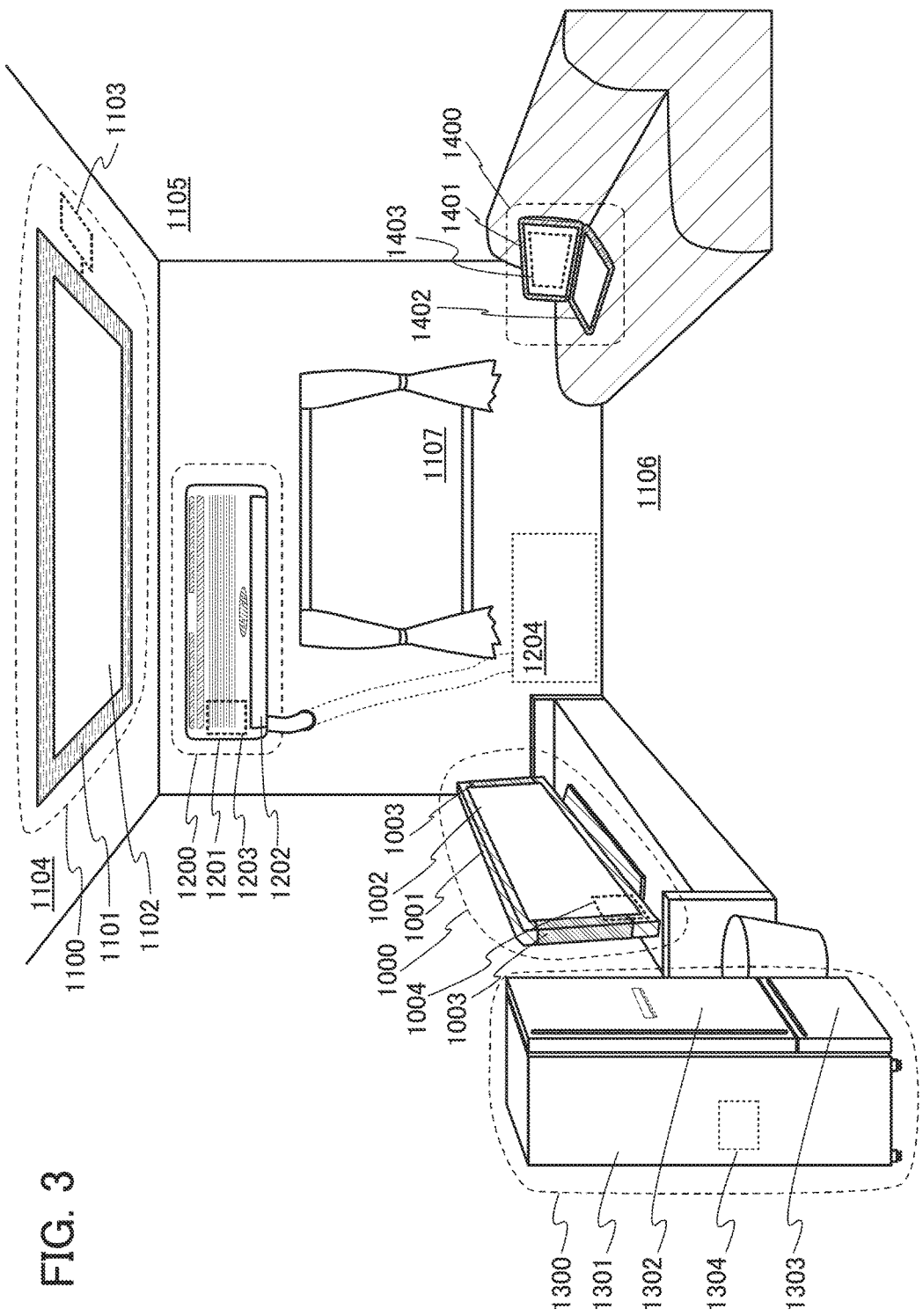
FIG. 3 illustrates application examples of a lithium secondary battery.
Figure 4A:
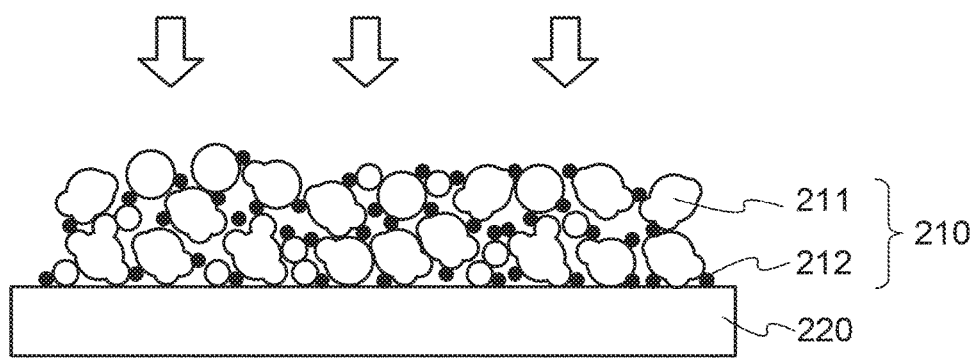
FIGS. 4A and 4B are cross-sectional views illustrating an example of a conventional positive electrode.
Figure 4B:
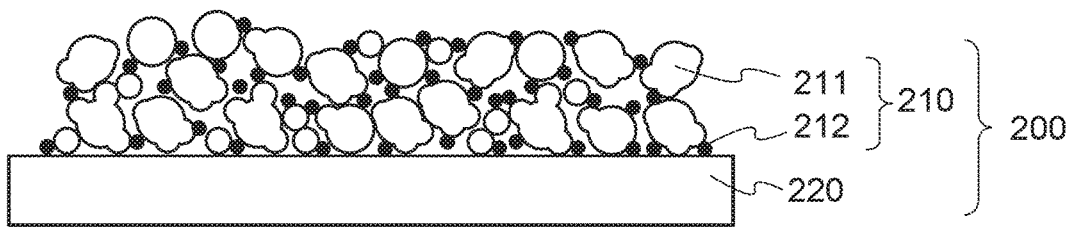

FIG. 3 illustrates specific structures of the electric appliances. In FIG. 3, a display device 1000 is an example of an electric appliance including a lithium secondary battery 1004 according to one embodiment of the present invention. Specifically, the display device 1000 corresponds to a display device for TV broadcast reception and includes a housing 1001, a display portion 1002, speaker portions 1003, the lithium secondary battery 1004, and the like. The lithium secondary battery 1004 according to one embodiment of the present invention is provided inside the housing 1001. The display device 1000 can receive electric power from a commercial power supply. Alternatively, the display device 1000 can use electric power stored in the lithium secondary battery 1004. Thus, the display device 1000 can be operated with the use of the lithium secondary battery 1004 according to one embodiment of the present invention as an uninterruptible power supply even when electric power cannot be supplied from the commercial power supply due to power failure or the like.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), a field emission display (FED), and the like can be used in the display portion 1002.

Note that the display device includes, in its category, all of information display devices for personal computers, advertisement displays, and the like other than TV broadcast reception.

In FIG. 3, an installation lighting device 1100 is an example of an electric appliance including a lithium secondary battery 1103 according to one embodiment of the present invention. Specifically, the lighting device 1100 includes a housing 1101, a light source 1102, and the lithium secondary battery 1103. Although FIG. 3 illustrates the example in which the lithium secondary battery 1103 is provided inside a ceiling 1104 provided with the housing 1101 and the light source 1102, the lithium secondary battery 1103 may be provided inside the housing 1101. The lighting device 1100 cart receive electric power from the commercial power supply. Alternatively, the lighting device 1100 can use electric power stored in the lithium secondary battery 1103. Thus, the lighting device 1100 can be operated with the use of the lithium secondary battery 1103 according to one embodiment of the present invention as an uninterruptible power supply even when electric power cannot be supplied from the commercial power supply because of power failure or the like.

Note that although FIG. 3 illustrates the example in which the installation lighting device 1100 provided in the ceiling 1104, the lithium secondary battery according to one embodiment of the present invention can be used in an installation lighting device provided in, for example, a wall 1105, a floor 1106, a window 1107, or the like other than the ceiling 1104. In addition, the lithium secondary battery can be used in a tabletop lighting device and the like.

As the light source 1102, an artificial light source which emits light artificially by using power can be used. Specifically, a discharge lamp such as an incandescent lamp and a fluorescent lamp, and a light-emitting element such as an LED and an organic EL element are given as examples of the artificial light source.

In FIG. 3, an air conditioner including an indoor unit 1200 and an outdoor unit 1204 is an example of an electric appliance including a lithium secondary battery 1203 according to one embodiment of the present invention. Specifically, the indoor unit 1200 includes a housing 1201, an air outlet 1202, and the lithium secondary battery 1203. Although FIG. 3 illustrates the example in which the lithium secondary battery 1203 is provided in the indoor unit 1200, the lithium secondary battery 1203 may be provided in the outdoor unit 1204. Alternatively, the lithium secondary battery 1203 may be provided in both of the indoor unit 1200 and the outdoor unit 1204. The air conditioner can receive electric power from a commercial power supply. Alternatively, the air conditioner can use electric power stored in the lithium secondary battery 1203. Specifically, in the case where the lithium secondary battery 1203 is provided in each of the indoor unit 1200 and the outdoor unit 1204, the air conditioner can be operated with the use of the lithium secondary battery 1203 according to one embodiment of the present invention as an uninterruptible power supply even when electric power cannot be supplied from the commercial power supply due to power failure or the like.

Note that although FIG. 3 illustrates the example in which the separated air conditioner including the indoor unit and the outdoor unit, the lithium secondary battery according to one embodiment of the present invention can be used in an air conditioner in which the functions of an indoor unit and an outdoor unit are integrated in one housing.

In FIG. 3, an electric refrigerator-freezer 1300 is an example of an electric appliance including a lithium secondary battery 1304 according to one embodiment of the present invention. Specifically, the electric refrigerator-freezer 1300 includes a housing 1301, a door for a refrigerator 1302, a door for a freezer 1303, the lithium secondary battery 1304, and the like. In FIG. 3, the lithium secondary battery 1304 is provided inside the housing 1301. The electric refrigerator-freezer 1300 can receive power from a commercial power supply. Alternatively, the electric refrigerator-freezer 1300 can use power stored in the lithium secondary battery 1304. Thus, the electric refrigerator-freezer 1300 can be operated with the use of the lithium secondary battery 1304 according to one embodiment of the present invention as an uninterruptible power supply even when power cannot be supplied from a commercial power supply due to power failure or the like.

Note that among the electric appliances described above, a high-frequency heating apparatus such as a microwave and an electric appliance such as an electric rice cooker require high electric power in a short time. The tripping of a circuit breaker of a commercial power supply in use of electric appliances can be prevented by using the lithium secondary battery according to one embodiment of the present invention as an auxiliary power supply for supplying electric power which cannot be supplied enough by a commercial power supply.

In addition, in a time period when electric appliances are not used, particularly when the proportion of the amount of power which is actually used to the total amount of power which can be supplied from a commercial power supply source (such a proportion referred to as a usage rate of power) is low, power can be stored in the lithium secondary battery, whereby the usage rate of power can be reduced in a time period when the electric appliances are used. In the case of the electric refrigerator-freezer 1300, for example, electric power can be stored in the lithium secondary battery at night time when the temperature is low and the door for a refrigerator 1302 and the door for a freezer 1303 are not opened and closed. The lithium secondary battery 1304 is used as an auxiliary power supply in daytime when the temperature is high and the door for a refrigerator 1302 and the door for a freezer 1303 are opened and closed; thus, the usage rate of electric power in daytime can be reduced.

In FIG. 3, a tablet terminal 1400 is an example of an electric appliance including a lithium secondary battery 1403 according to one embodiment of the present invention. Specifically, the tablet terminal 1400 includes a housing 1401, a housing 1402, the lithium secondary battery 1403, and the like. The housing 1401 and the housing 1402 each include a display portion having a touch-panel function. A user can carry out operation of contents which are displayed on the display portion by touching the displayed contents with a finger or the like. In addition, the tablet terminal 1400 can be folded so that the display portions of the housing 1401 and the housing 1402 are inside, which enables protection of the display portions as well as miniaturization. The use of the lithium secondary battery 1403 according to one embodiment of the present invention allows miniaturization of the tablet terminal 1400 and long-time use of the tablet terminal 1400 as a mobile tablet terminal.

Note that this embodiment can be implemented in appropriate combination with any of the structures of the other embodiments and example.

Example 1

A positive electrode for a lithium secondary battery which is one embodiment of the present invention was actually formed in the example. Evaluation results of the orientation of a positive electrode active material layer and battery properties thereof will be described in this example with reference to FIG. 5, FIG. 6, FIG. 7, FIG. 8, and FIG. 9.
<Formation of Lithium-Containing Composite Oxide>

In this example, lithium iron phosphate which was synthesized by a hydrothermal method was used as lithium-containing composite oxide having an olivine structure.

Lithium hydroxide monohydrate (LiOH.H$_2$O), iron(II) chloride tetrahydrate (FeCl$_2$.4H$_2$O), and ammonium dihydrogen phosphate (NH$_4$H$_2$PO$_4$) were used as materials for the lithium iron phosphate.

LiOH.H$_2$O, FeCl$_2$.4H$_2$O, and NH$_4$H$_2$PO$_4$ were weighed so that the molar ratio thereof was 2:1:1. In this example, 0.06 mol of LiOH.H$_2$O, 0.03 mol of FeCl$_2$.4H$_2$O, and 0.03 mol of NH$_4$H$_2$PO$_4$ were weighed.

The following experiment was carried out in a nitrogen atmosphere. First, the materials were each dissolved in 30 ml of deoxygenated water. The deoxygenated water was formed in such a manner that water was subjected to bubbling in advance using nitrogen.

Next, while the ammonium dihydrogen phosphate solution was stirred with a stirrer, the lithium hydroxide solution was gradually added thereto, so that a solution in which lithium phosphate (Li$_3$PO$_4$) was precipitated was prepared.

Then, while the iron(II) chloride solution was stirred with a stirrer, the solution in which the lithium phosphate was suspended was gradually added thereto, so that a suspension containing a precursor of lithium iron phosphate was prepared. After that, water which was subjected to deoxidation was added thereto so that the total amount was 100 ml.

Next, the suspension containing the precursor was put in a reaction container for hydrothermal synthesis which included an inner cylinder made of a fluororesin (Mini reactor MS-type MS200-C manufactured by OM labotech Corp.). Then, while the suspension was stirred, the suspension was heated at 150° C. and approximately 0.4 MPa for 15 hours to cause hydrothermal reaction.

After the reaction, the resulting lithium iron phosphate was collected by filtration and cleaned with pure water ten times. After the cleaning, the obtained lithium iron phosphate was dried at 50° C. under reduced pressure for 12 hours or more.

Figure 5:
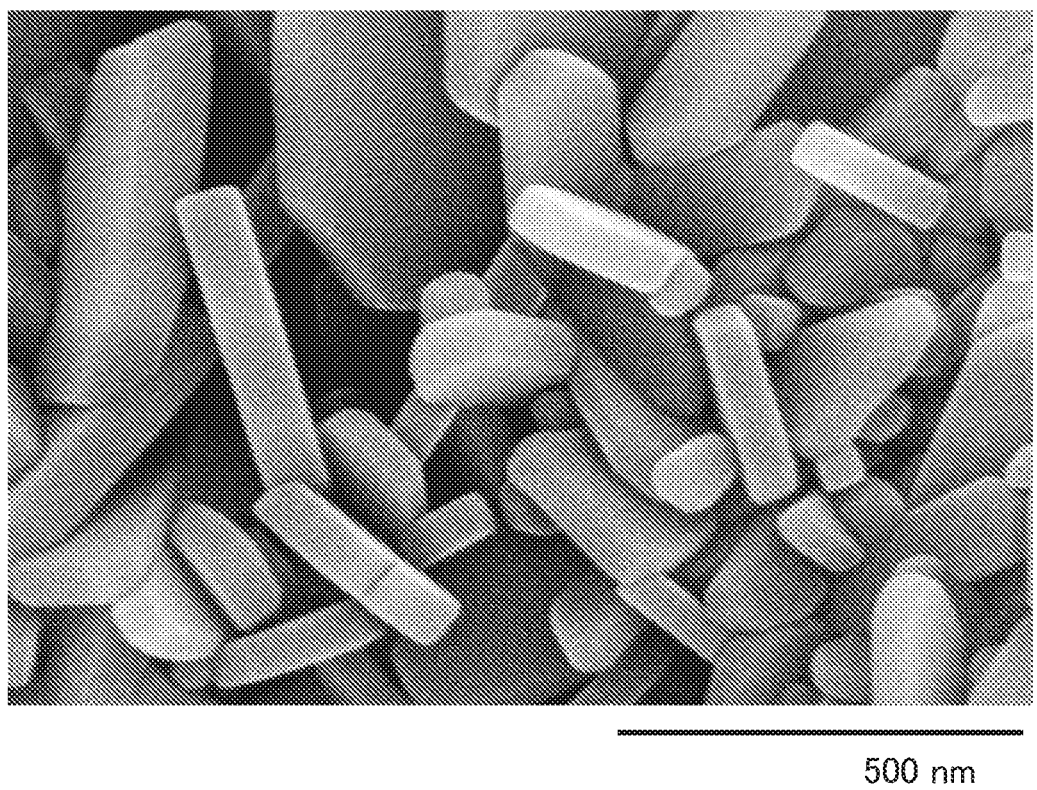
FIG. 5 is a scanning electron micrograph of lithium iron phosphate particles used for a positive electrode according to one embodiment of the present invention.

FIG. 5 shows the scanning electron micrograph of the obtained lithium iron phosphate. The observation was performed at an acceleration voltage of 10.0 kV and a magnification of 100,000 times. As shown in FIG. 5, a large number of particles which were flat rectangular parallelepipeds or flat polygonal prisms were observed. The lithium iron phosphate was used for a positive electrode.

<Formation of Graphene Oxide or Multilayer Graphene Oxide>

First, graphite was subjected to oxidation treatment, thereby obtaining graphite oxide. The graphite oxide was put in a solution and subjected to ultrasonic waves to become flakes, so that graphene oxide or multilayer graphene oxide was obtained. The resulting graphene oxide or multilayer graphene oxide was dried, whereby graphene oxide powder or multilayer graphene oxide powder was obtained.

<Manufacture of Positive Electrode>

The lithium iron phosphate and the graphene oxide or multilayer graphene oxide were mixed with each other at a ratio of 97.5:2.5 [weight ratio] and then ground. In this example, 0.1380 g of the lithium iron phosphate and 0.0072 g of the graphene oxide were used. Ethanol was use as a solvent in the grinding. The grinding was performed at 400 rpm for 4 hours using a ball mill with balls with a diameter of 1 mm. After that, the ethanol was evaporated and the resulting mixture was dried.

N-Methyl-2-pyrrolidone (NMP) was mixed to the dried mixture of the lithium iron phosphate and the graphene oxide or multilayer graphene oxide, thereby providing slurry. In this example, 0.478 g of NMP was mixed.

Aluminum foil was used for the positive electrode current collector. The slurry was applied over the aluminum positive electrode current collector to have a thickness of approximately 100 µm and dried at 120° C. with a vacuum drier, so that a positive electrode material layer was obtained. After the drying, pressure was applied to the aluminum positive electrode current collector and the positive electrode active material layer with a roller press machine.

After that, baking was performed. As a result, the graphene oxide or multilayer graphene oxide in the positive electrode active material layer was reduced to become reduced graphene oxide or reduced multilayer graphene oxide. The baking was performed with a glass tube oven under reduced pressure by using a diaphragm pump at 200° C. for 1 hour and then at 300° C. for 10 hours.

After that, the aluminum positive electrode current collector and the positive electrode active material layer were stamped out into a round shape with a diameter of 12 mm, thereby providing the positive electrode.

<XRD Analysis of Positive Electrode>

Figure 6:
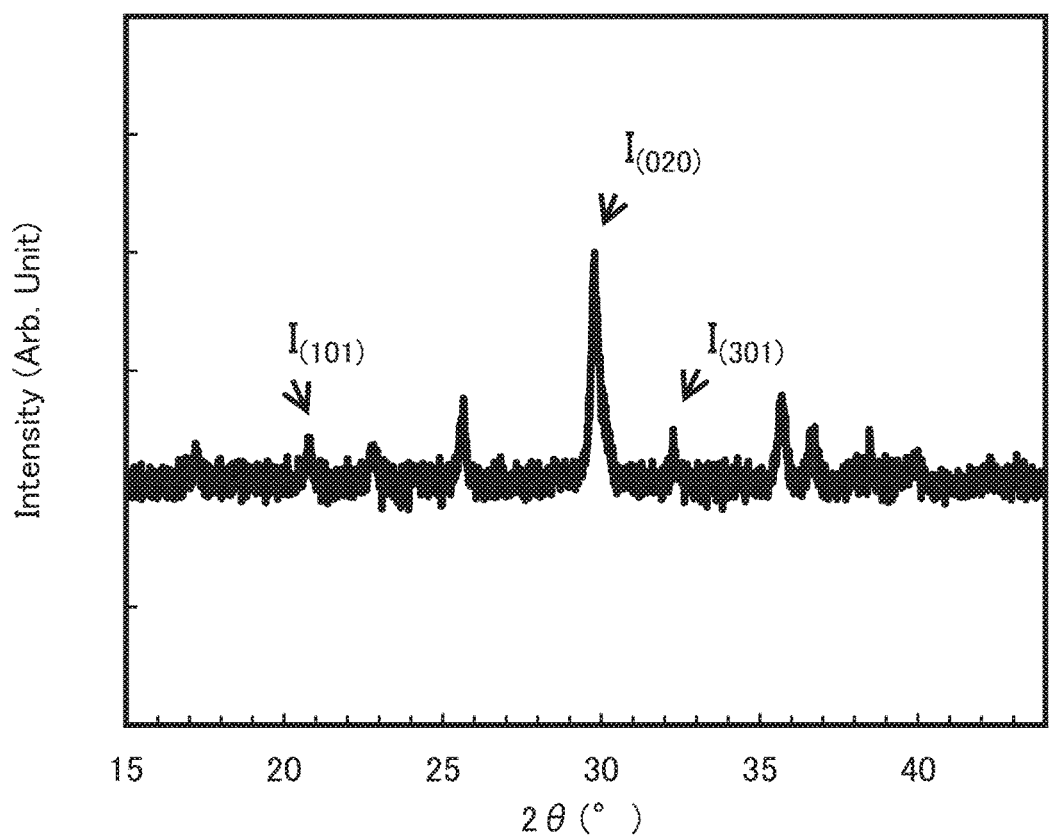
FIG. 6 shows an XRD measurement result of a positive electrode according to one embodiment of the present invention.
Figure 7:
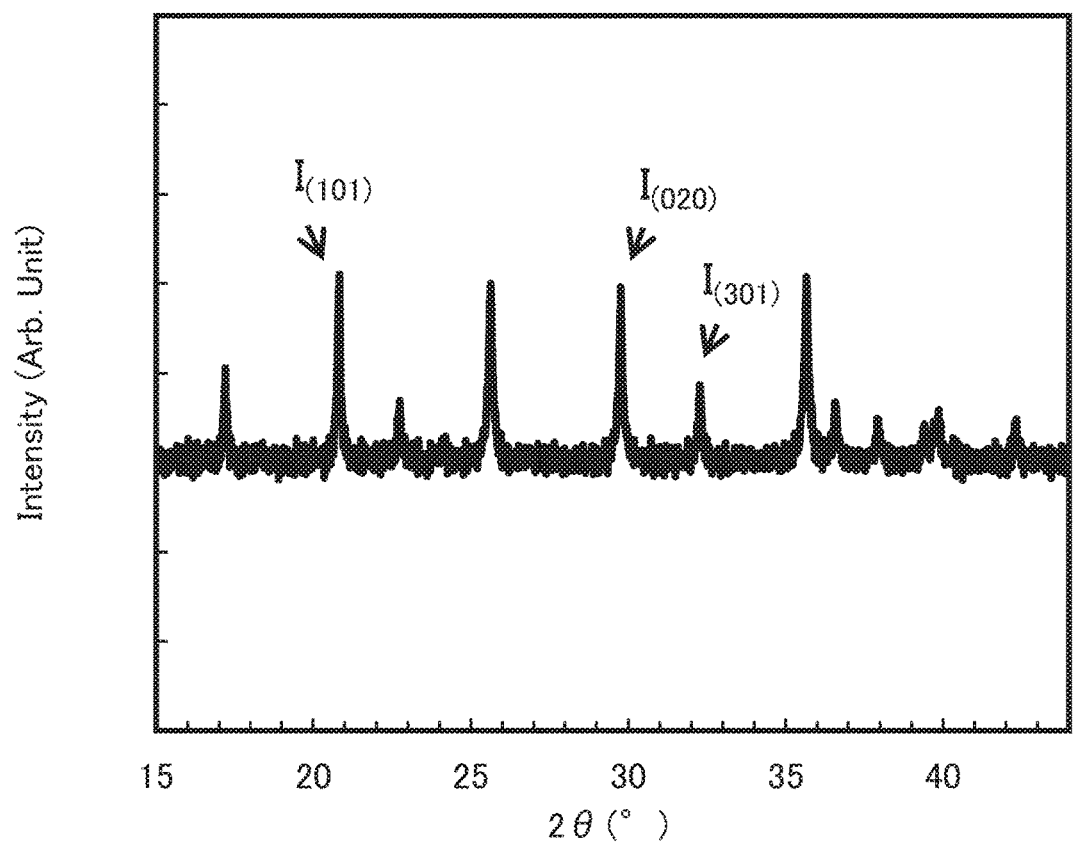
FIG. 7 shows an XRD measurement result of a reference example.

FIG. 6 shows a XRD measurement result of the positive electrode, which was manufactured as described above. FIG. 7 shows an XRD measurement result of a lithium iron phosphate particle which was synthesized by a solid-phase method, as a reference example. The horizontal axis represents a diffraction angle (2θ) and the vertical axis represents diffraction intensity.

It is known that a peak of the (020) plane, which is vertical to the b-axis, appears around a diffraction angle of 29.7°, a peak of the (101) plane, which is not vertical to the b-axis, appears around a diffraction angle of 20.8°, and a peak of the (301) plane, which is not vertical to the b-axis, appears around a diffraction angle of 32.2° in XRD spectrum of lithium iron phosphate (Anna S. Andersson et al., "Lithium extraction/insertion in LiFePO$_4$: an X-ray diffraction and Mössbauer spectroscopy study", *Solid State Ionics*, volume 130, pp. 41-52 (2000)).

In the case of the positive electrode of FIG. 6, a diffraction peak intensity ratio of the (020) plane, which is vertical to the b-axis, with respect to the (101) plane, which is not vertical to the b-axis, (I$_{(020)}$/I$_{(101)}$) was 4.60. In addition, a diffraction peak intensity ratio of the (020) plane, which is vertical to the b-axis, with respect to the (301) plane, which is not vertical to the b-axis, (I$_{(020)}$/I$_{(301)}$) was 4.01.

In the case of the lithium iron phosphate particle of FIG. 7, a diffraction peak intensity ratio of the (020) plane, which is vertical to the b-axis, with respect to the (101) plane, which is not vertical to the b-axis, (I$_{(020)}$/I$_{(101)}$) was 0.93. Further, a diffraction peak intensity ratio of the (020) plane, which is vertical to the b-axis, with respect to the (301) plane, which is not vertical to the b-axis, (I$_{(020)}$/I$_{(301)}$) was 2.25.

FIG. 6 and FIG. 7 show that the peak of the (020) plane, which is vertical to the b-axis, of the positive electrode which is one embodiment of the present invention is relatively high and the peaks of planes including the (101) plane and the (301) plane, which are not vertical to the b-axis, of the positive electrode are relatively low as compared to those of the reference lithium iron phosphate particle. That is, those results show that the b-axes of lithium iron phosphate single crystal particles in the positive electrode active material layer are oriented vertically to the surface of the positive electrode current collector in the positive electrode which is one embodiment of the present invention.

<Formation of Positive Electrode as Comparative Example>

As an example of a conventional positive electrode, a positive electrode was formed using acetylene black as a conductive agent and PVdF as a binder instead of reduced graphene oxide. A mixing ratio was lithium iron phosphate:

acetylene black:PVdF=85:8:7. Formation conditions except the mixing ratio were the same as those of the positive electrode of one embodiment of the present invention.

<Battery Properties>

The battery properties of the positive electrode in which the b-axes of the lithium iron phosphate single crystal particles were oriented vertically to the surface of the positive electrode current collector were evaluated.

To evaluate the battery properties, a cell was manufactured using the positive electrode formed as described above as a working electrode and Li metal as a counter electrode. Polypropylene (PP) was used for a separator. A solution obtained by dissolving lithium hexafluorophosphate ($LiPF_6$) having a concentration of 1 mol/L to a mixed solution of an ethylene carbonate (EC) solution and diethyl carbonate (DEC) (the volume ratio=1:1) was used as an electrolyte solution.

Figure 8:
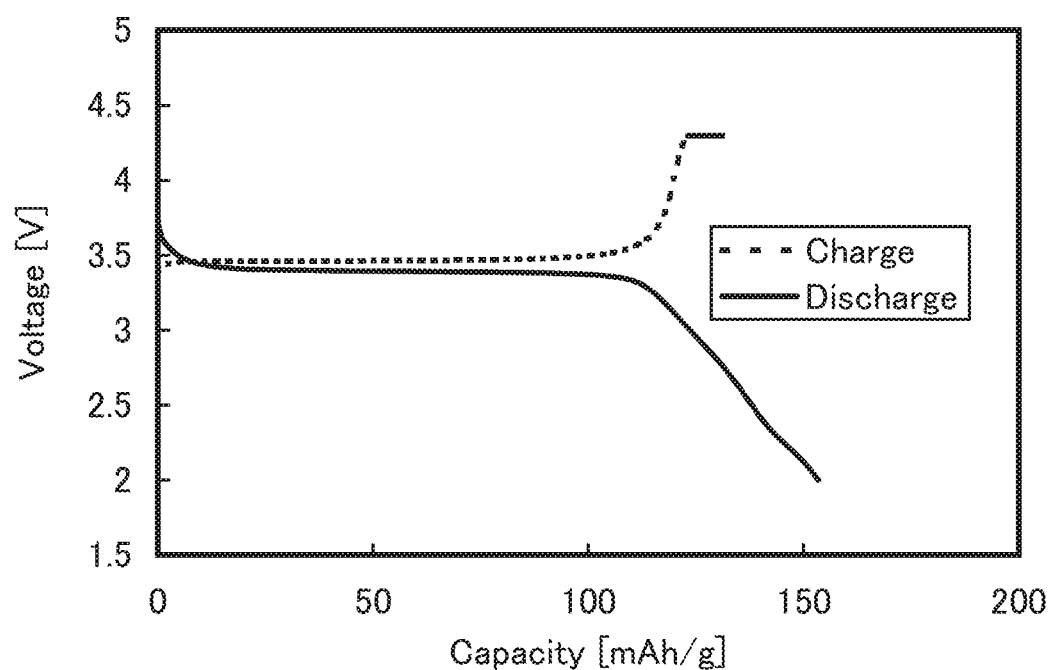
FIG. 8 shows charge and discharge characteristics of a lithium secondary battery including a positive electrode according to one embodiment of the present invention.
Figure 9:
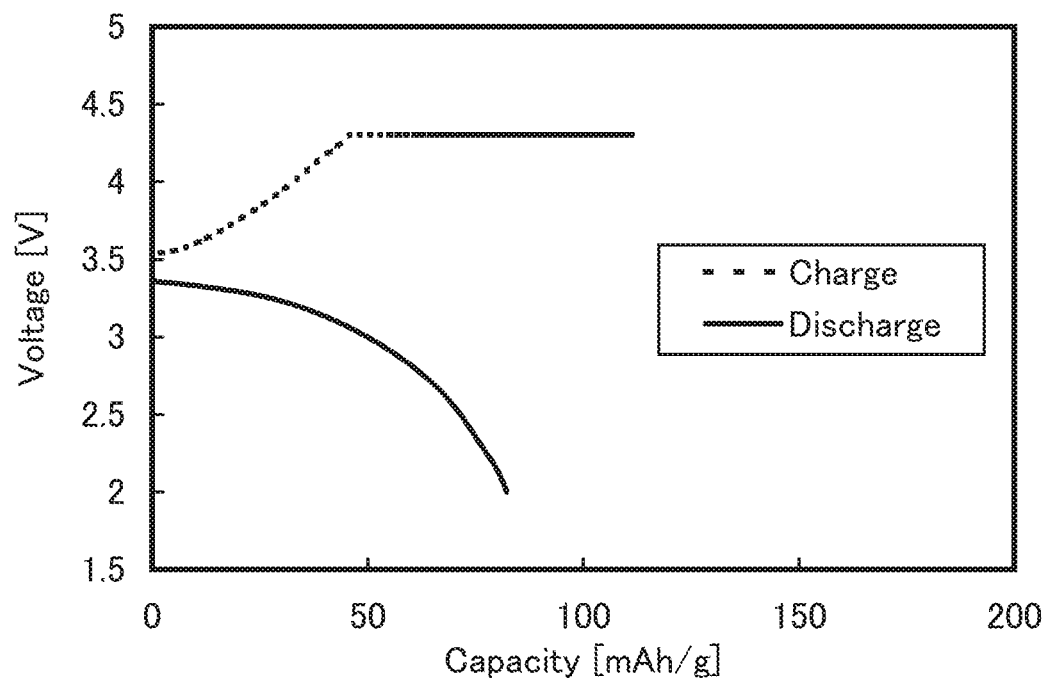
FIG. 9 shows charge and discharge characteristics of a lithium secondary battery including a conventional positive electrode.

FIG. 8 shows the charge and discharge characteristics of the positive electrode according to one embodiment of the present invention, and FIG. 9 shows the charge and discharge characteristics of the conventional positive electrode. The vertical axis represents voltage and the horizontal axis represents capacity.

FIG. 8 and FIG. 9 show that the positive electrode according to one embodiment of the present invention is improved in charge capacity and discharge capacity as compared to the conventional example.

This application is based on Japanese Patent Application serial no. 2011-197021 filed with Japan Patent Office on Sep. 9, 2011, the entire contents of which are hereby incorporated by reference.

What is claimed is:

1. A positive electrode for a lithium secondary battery comprising:
   a positive electrode current collector; and
   a positive electrode active material layer over the positive electrode current collector,
   wherein the positive electrode active material layer includes:
      a plurality of active material particles; and
      a graphene oxide,
      wherein the plurality of active material particles are a lithium-containing composite oxide having an olivine structure, and
      wherein a peak intensity ratio of a (020) diffraction to a (101) diffraction of the lithium-containing composite oxide having the olivine structure in a X-ray diffraction spectrum of the positive electrode active material layer is greater than or equal to 4.5 and less than or equal to 5.5.

2. The positive electrode for a lithium secondary battery according to claim 1, wherein the lithium-containing composite oxide having the olivine structure is lithium iron phosphate.

3. The positive electrode for a lithium secondary battery according to claim 1, wherein the plurality of active material particles are rectangular parallelepiped or substantially rectangular parallelepiped particles.

4. The positive electrode for a lithium secondary battery according to claim 1, wherein the plurality of active material particles are rectangular parallelepiped or substantially rectangular parallelepiped single crystal particles.

5. The positive electrode for a lithium secondary battery according to claim 4, wherein b-axis of the rectangular parallelepiped or substantially rectangular parallelepiped single crystal particles are oriented vertically to a surface of the positive electrode current collector.

6. The positive electrode for a lithium secondary battery according to claim 4, wherein length in a b-axis direction of the rectangular parallelepiped or substantially rectangular parallelepiped single crystal particles are shorter than lengths in an a-axis direction and a c-axis direction of the rectangular parallelepiped or substantially rectangular parallelepiped single crystal particles.

7. The positive electrode for a lithium secondary battery according to claim 1, wherein the graphene oxide is multi-layer graphene oxide including 2 to 100 graphene oxide sheets.

8. The positive electrode for a lithium secondary battery according to claim 1, wherein one of surface of the graphene oxide is contact with at least two of the plurality of active material particles, and
   wherein another of surface of the graphene oxide is contact with the other of at least two of the plurality of active material particles.

9. The positive electrode for a lithium secondary battery according to claim 1, wherein the graphene oxide is reduced.

10. The positive electrode for a lithium secondary battery according to claim 5, wherein a number of rectangular parallelepiped or substantially rectangular parallelepiped particle having the b-axis thereof oriented vertically to the surface of the positive electrode current collector is larger than a number of rectangular parallelepiped or substantially rectangular parallelepiped particle oriented in other axes directions.

11. A lithium secondary battery comprising:
    a negative electrode;
    an electrolyte solution; and
    the positive electrode for a lithium secondary battery according to claim 1.

12. A positive electrode for a lithium secondary battery comprising:
    a positive electrode current collector; and
    a positive electrode active material layer over the positive electrode current collector,
    wherein the positive electrode active material layer includes:
       a plurality of active material particles; and
       a graphene oxide,
       wherein the plurality of active material particles are rectangular parallelepiped or substantially rectangular parallelepiped single crystal particles, and
       wherein a peak intensity ratio of a (020) diffraction to a (101) diffraction of the plurality of active material particles in a X-ray diffraction spectrum of the positive electrode active material layer is greater than or equal to 4.5 and less than or equal to 5.5.

13. The positive electrode for a lithium secondary battery according to claim 12, wherein the plurality of active material particles are a lithium-containing composite oxide having an olivine structure.

14. The positive electrode for a lithium secondary battery according to claim 13, wherein the lithium-containing composite oxide having the olivine structure is lithium iron phosphate.

15. The positive electrode for a lithium secondary battery according to claim 12, wherein b-axis of the plurality of active material particles are oriented vertically to a surface of the positive electrode current collector.

16. The positive electrode for a lithium secondary battery according to claim 12, wherein length in a b-axis direction of the plurality of active material particles are shorter than lengths in an a-axis direction and a c-axis direction of the plurality of active material particles.

17. The positive electrode for a lithium secondary battery according to claim 12, wherein the graphene oxide is multilayer graphene oxide including 2 to 100 graphene oxide sheets.

18. The positive electrode for a lithium secondary battery according to claim 12, wherein one of surface of the graphene oxide is contact with at least two of the plurality of active material particles, and wherein another of surface of the graphene oxide is contact with the other of at least two of the plurality of active material particles.

19. The positive electrode for a lithium secondary battery according to claim 12, wherein the graphene oxide is reduced.

20. A lithium secondary battery comprising:
a negative electrode;
an electrolyte solution; and
the positive electrode for a lithium secondary battery according to claim 12.

* * * * *